United States Patent
Nelson et al.

(10) Patent No.: US 7,498,759 B2
(45) Date of Patent: Mar. 3, 2009

(54) SEMICONDUCTOR WAFER PROCESSING ACCELEROMETER

(75) Inventors: Matthew T. Nelson, Boise, ID (US); Kent C. McBride, Boise, ID (US); Paul L. Taylor, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 151 days.

(21) Appl. No.: 11/465,262

(22) Filed: Aug. 17, 2006

(65) Prior Publication Data

US 2008/0042608 A1    Feb. 21, 2008

(51) Int. Cl.
*B25J 9/10* (2006.01)
(52) U.S. Cl. .................. 318/568.17; 318/561; 702/191
(58) Field of Classification Search . 318/568.1–568.25, 318/561; 700/245–264; 901/20, 3, 6, 9; 438/10
See application file for complete search history.

(56) References Cited

U.S. PATENT DOCUMENTS

| | | | | |
|---|---|---|---|---|
| 7,140,655 B2* | 11/2006 | Kesil et al. | .................. | 294/104 |
| 2005/0281661 A1* | 12/2005 | Kesil et al. | ............... | 414/744.5 |
| 2005/0288893 A1* | 12/2005 | Gassner | ...................... | 702/182 |
| 2006/0222480 A1* | 10/2006 | Duhamel et al. | ......... | 414/744.8 |
| 2007/0067678 A1* | 3/2007 | Hosek et al. | .................. | 714/25 |

* cited by examiner

*Primary Examiner*—Rita Leykin
(74) *Attorney, Agent, or Firm*—Schwegman, Lundberg & Woessner, P.A.

(57) ABSTRACT

An end effector of a robot tool that includes accelerometers and methods to sense end effector motion. A semiconductor substrate or similar object may be supported by the end effector. Motion of the end effector and associated substrate movement may be transduced and sampled according to specified conditions. The sampled data may be processed, stored and analyzed for subsequent use, and/or may be used in near real time to control end effector movement. Sampled data representative of mechanical events associated with end effector movement may be communicated to a remotely operated processor system.

49 Claims, 3 Drawing Sheets

SEMICONDUCTOR WAFER PROCESSING ACCELEROMETER

TECHNICAL FIELD

Embodiments of the present invention pertain generally to automation, including the use of accelerometers for wafer level processing.

BACKGROUND

Automated process tools can reduce personal and environmental injury risks and increase manufacturing efficiency, particularly with respect to the semiconductor products industry. This is because process tool up-time contributes to efficient manufacturing.

Automated process tools may include robot tools. Robot tools generally include an end effector. An end effector is typically a functional device attached at one end of a robot tool or other such controllable system of moving components. The structure of an end effector and the nature of the programming and associated mechanical components will typically depend on the intended task. One example of an end effector is a gripper shaped to perform as a clamp. Since an end effector can be responsible for much of the wear experienced by a robot tool, and much of its movement, it is generally desirable to improve its control. Better diagnostics and control features on the end effector may reduce tool repair times and enhance tool use, and consequently, reduce manufacturing costs. Enhanced diagnostics may also reduce damage to objects supported by the end effector, such as semiconductor substrates, that may be incurred while the robot tool is in motion.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in this document.

DETAILED DESCRIPTION

Figure 1:
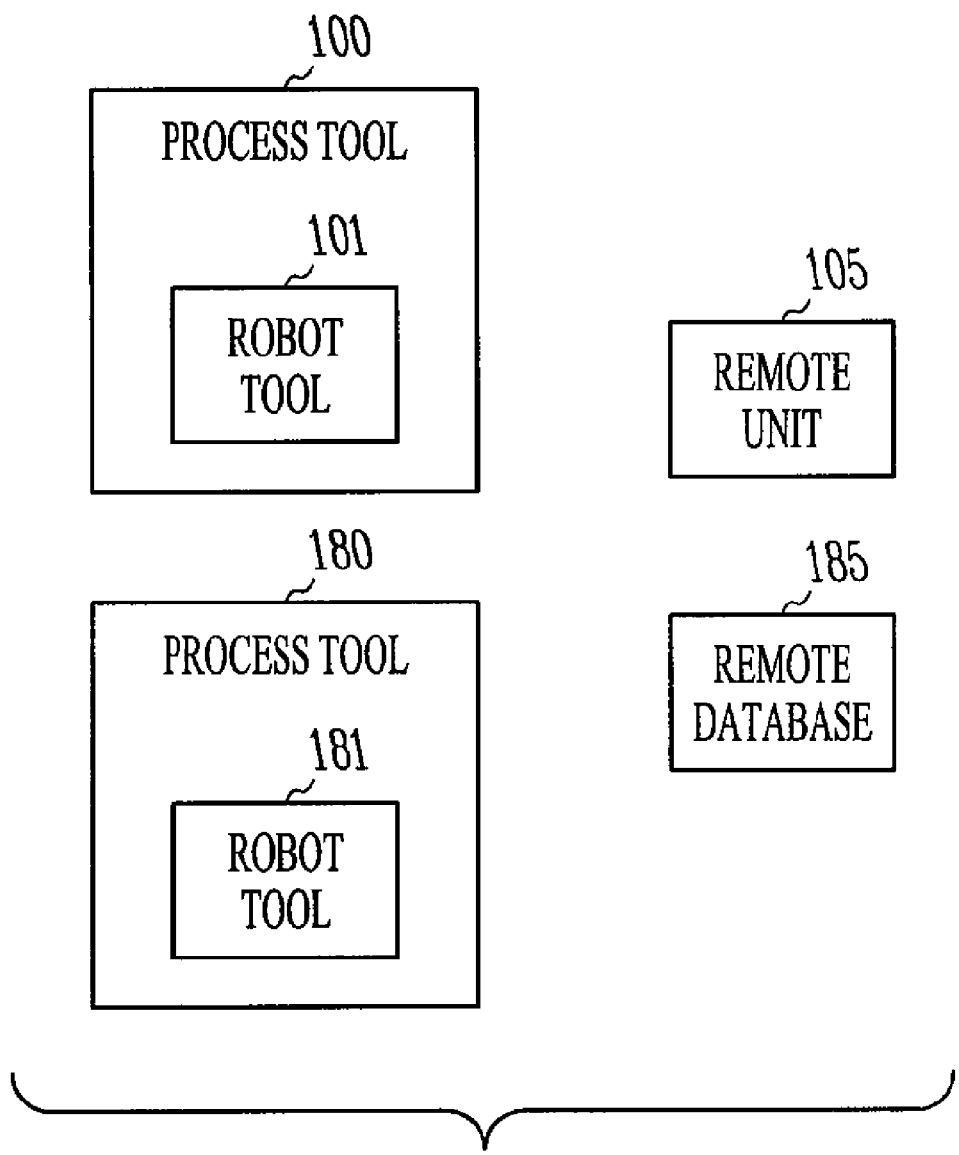
FIG. 1 is a block diagram illustrating generally a process tool according to various embodiments of the invention.

FIG. 1 is a schematic view illustrating generally an embodiment of a process tool 100. In this embodiment, the process tool 100 includes a robot tool 101 and a remote unit 105. The robot tool 101 and the process tool 100 may be formed as a single unit or as separate units (shown in FIG. 1), depending on the specific process or tool. The robot tool 101 and the process tool 100 may interactively communicate instructions and data between them to perform a specified task. The robot tool 101 and/or the process tool 100 may further cooperate with the remote unit 105 to perform a particular function or series of tasks. Examples of process tools include semiconductor process systems such as etching systems, epitaxial deposition systems, metal deposition systems, crystal growth systems, rapid thermal annealing systems and the like. Examples of a remote unit include computer systems, databases, and network servers and the like. In some embodiments, the remote unit transmits commands to the process tool. In various embodiments, the remote unit receives information from the process tool.

In some embodiments, the robot tool 101 accepts commands from and transmits information to the process tool 100. In some embodiments, the robot tool 101 communicates with the remote unit 105. In some embodiments, the robot tool 101 may accept commands from and transmits information to the remote unit 105 independent of the process tool 100. In some embodiments, the robot tool 101 may accept commands from and transmits information to the remote unit 105 in real time. In various embodiments, the process tool 100, the robot tool 101, and the remote unit 105 cooperate to exchange information nearly concurrently to perform a function or specified task.

In some embodiments, the robot tool 101 may be located substantially within the process tool 100 (as shown in FIG. 1). In various embodiments, the robot tool 101 maybe located substantially external to the process tool 100. In some embodiments, the robot tool 101 may cooperate with another process tool 180 to perform a task. In various embodiments, the robot tool 101 may cooperate with another robot tool 181 associated with the same process tool 100 or a different process tool 180. In some embodiments, the robot tool 101 may operate as a shared tool among one or more other process tools 100, 180. In various embodiments, the remote unit 105 may operatively communicate with a central processing unit associated with a manufacturing plant. In some embodiments, the remote unit 105 may operate according to data stored in a remote data base.

Figure 2:
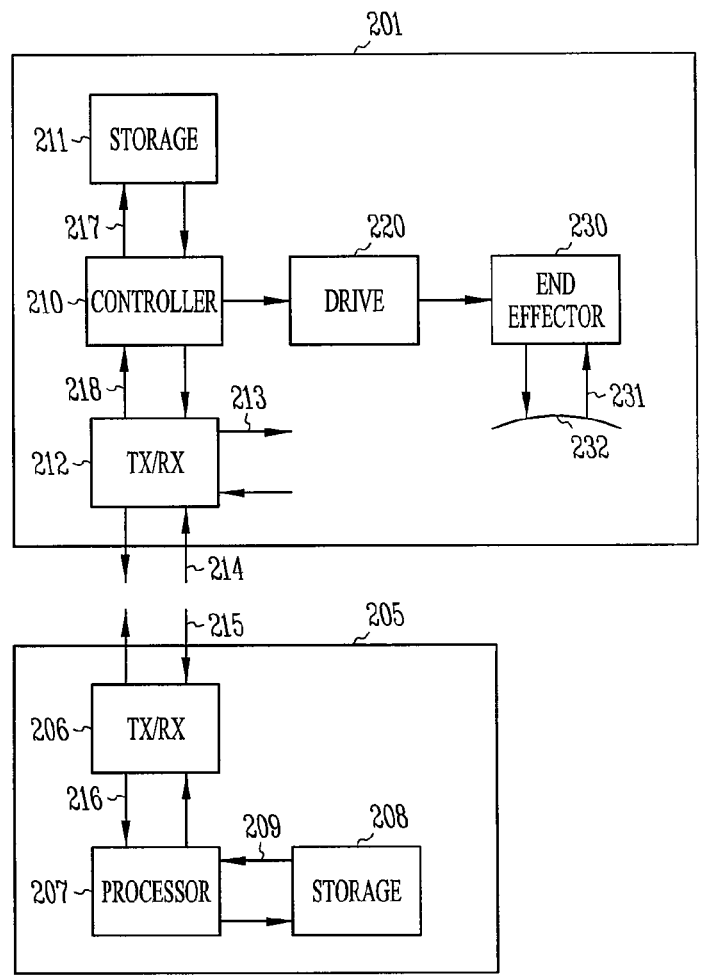
FIG. 2 is a block diagram illustrating generally, a robot tool and a remote unit according to various embodiments of the invention.

FIG. 2 is a schematic view illustrating generally, one embodiment of a robot tool 201 and a remote unit 205. In some embodiments, the remote unit 205 (which may be similar to or identical to the remote unit 105) is optional. In this embodiment, the process tool 201 (which may be similar to or identical to the process tool 101) includes a controller 210 coupled via communications channel 218 to accept commands from and to transmit data to transmit and receive circuitry 212. In some embodiments, the transmit and receive circuitry 212 may include a transceiver module. In various embodiments, the transmit and receive circuitry 212 may include radio frequency circuitry for wireless communications. The controller 210 is further electrically coupled to a mechanical drive 220. In some embodiments the controller 220 is a stepper motor controller. The mechanical drive 220 is operably coupled to the end effector 230 to move the end effector 230 according to signals received from controller 210. In general, operation of the mechanical drive 220 depends on the process or function to be performed. In some embodiments, the mechanical drive 220 includes a stepper motor. In various embodiments, the mechanical drive 220 is mechanically coupled to a stepper motor. In some embodiments, the mechanical drive 220 includes a robot arm. Various embodiments include a mechanical drive 220 that has some of the same functions as a robot arm. The controller 210 may be further coupled via the communications channel 217 to a storage device 211 to store information received from the controller 210. In some embodiments, the storage device 211 receives data using transmit and receive circuitry 212. The transmit and receive circuitry 212 may be further communicatively coupled via the communication channel 213 to the end effector 230 to accept data from and/or provide data to the end effector 230. In some embodiments, the end effector 230 transmits and receives data using a transceiver module (not shown) via the communications channel 231 coupled to antenna 232. In various embodiments, the end effector 230 includes circuitry (not shown) for wireless communications. In some embodiments, the end effector 230 transmits and receives information to transmit and receive circuitry 212 using a conductor such as a transmission line, a power line, or a data bus. In some embodiments, the end effector 230 may be configured with transmit and receive circuitry 212, the controller 210, and the drive 220 to form part of a feedback path. In such embodiments, information provided from the end effector 230 to the transmit and receive circuitry 212 is transmitted to controller 210 for processing and adjustment of the mechanical drive 220 and/or the end effector 230. In some embodiments, the information transmitted in a feedback configuration may be received by the storage device 211 via the communication channel 217 for further use and analysis. In various embodiments, the storage device 211 may store parameter information and characteristics associated with a specific tool, process activity, process sequence, and end effector. In various embodiments, the storage device 211 includes a magnetic disk drive. In some embodiments, the storage device 211 includes a semiconductor memory device such as a static random access memory (SRAM), a dynamic RAM (DRAM), and/or a flash memory.

The design and shape of the end effector 230 attached to a robot tool 201 generally depends on the process tool and intended operation. In some embodiments, the end effector 230 may be removably attached to the mechanical drive 220 such that the same or similar end effector may be substituted. In various embodiments, the end effector 230 is attached such that it can be replaced with an end effector 230 that performs a different function. Examples of such functions include, without limitation, grabbing, supporting, spreading, rotating, elevating, shifting, tipping, and twisting. In some embodiments, the end effector 230 cooperates with another end effector. In various embodiments, the end effector 230 supports another end effector that may perform the same, similar, or an entirely different function. In various embodiments, the end effector 230 supports a platen containing one or more substrates. In various embodiments, the end effector 230 supports a semiconductor substrate. In some embodiments, the semiconductor substrate includes circuitry associated with a semiconductor memory such as an output driver circuit, a DRAM, a SRAM, and a flash memory. In various embodiments, the substrate includes a portion of a circuit associated with a semiconductor memory such as capacitors, electrodes, conductors, transistors, and insulators.

In various embodiments, the remote unit 205 is communicatively coupled to the robot tool 201 at inputs/outputs 215, 214, respectively, using transmit and receive circuitry 206. The transmit and receive circuitry 206 may be coupled to a processor 207 via the channel 216 to provide and accept information associated with a process tool, process activity, process sequence, or an end effector, for example. In various embodiments, the processor 207 may comprise a microprocessor. Remote unit 205 may be configured with the end effector 230, a mechanical drive 220, a controller 210 and an end effector 230 to form part of a feedback path using the processor 207 and transmit and receive circuitry 206. In a feedback configuration, the end effector 230 may provide information to the remote unit 205 using transmit and receive circuitry 206 and transmit and receive circuitry in the end effector (not shown), independent of the transmit and receive circuitry 212. In various embodiments, in a feedback configuration, the end effector 230 may provide information to transmit and receive circuitry 206 in addition to information provided to transmit and receive circuitry 212. The processor 207 may be further coupled via channel 209 to the storage device 208 to transmit and receive information associated with a process activity, an end effector, an end effector movement, a robot tool, robot tool movement, one or more process tools, or information related to feedback operation of the robot tool, for example. Information transferred to the storage device 208 may be used in conjunction with future or concurrent operations of a robot or process tool.

The end effector 230 may be used with remote unit 205 to operate the process tool or robot tool 201 in a non-feedback configuration, or to provide information associated with a process or information for subsequent analysis. In various embodiments, the end effector 230 may transmit information to and receive information from the transmit and receive circuitry 206, independent of the transmit and receive circuitry 212. In some embodiments, the end effector 230 may transmit information to and receive information from the transmit and receive circuitry 206 in addition to information exchanged with the transmit and receive circuitry 212. In some embodiments, the storage device 208 includes a magnetic recording media. In various embodiments, the storage device 208 includes a semiconductor memory such as a SRAM, a DRAM and a flash memory.

In some embodiments, the transmit and receive circuitry 206 may include a transceiver module such as a wireless transceiver module. In some embodiments the inputs/outputs 214, 215 may be coupled to electrical conductors such as a data bus, a transmission line, and/or a power line. In various embodiments, the input/outputs 214, 215 may be coupled to respective antennas (not shown) to transfer information between the remote unit 205 and the robot tool 201 or the process tool. In some embodiments, either the input/outputs 214 or the inputs/outputs 215 maybe coupled to an antenna for free space transmission and reception. In various embodiments, the transmit and receive circuitry 206, 212 may use a wireless transmission protocol. In various embodiments, the transmit and receive circuitry 206, 212 may use a synchronous transmission protocol. In some embodiments, the transmit and receive circuitry 206, 212 may use an asynchronous transmission protocol. Examples of protocols that may be used, include without limitation, the BLUETOOTH™ protocol, the IEEE 802.15.1 protocol, the IEEE 802.15.3 protocol, and various 802.11g protocols.

Figure 3:
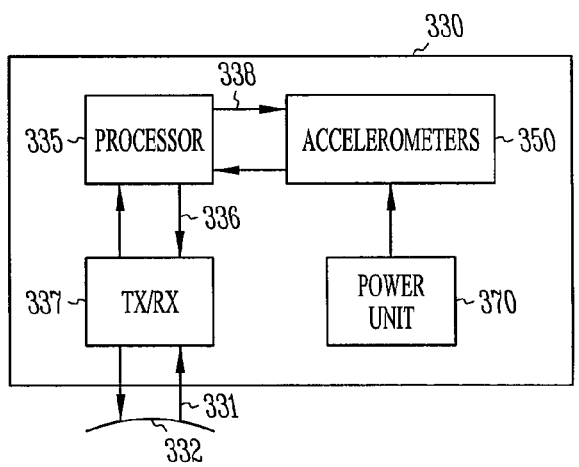
FIG. 3 is a block diagram illustrating generally an end effector according to various embodiments of the invention of the invention.

FIG. 3 is a schematic view illustrating generally one embodiment of an end effector 330. In this embodiment, the end effector 330 (which may be similar to or identical to the end effector 230) includes a processor 335 electrically coupled via communication channel 336 to transmit and receive circuitry 337 and to accelerometers 350 via communication channel 338. Using channel 336, the transmit and receiver circuitry 337 may provide information to the processor 335 via the communications channel 331 received from antenna 332. In some embodiments, the transmit and receive circuitry 337 communicates with transmitter and receiver circuitry coupled to a controller such as a processor or a stepper motor controller associated with a robot tool. In some embodiments, the transmit and receive circuitry 337 communicates with transmitter and receiver circuitry associated with a remote processing unit such as a central computer or a network server. Using channel 338, the accelerometers 350 can transmit to and receive from the processor 335 information associated with movement and mechanical events associated with the end effector 330.

In general, movement may cause time dependent mechanical oscillations or mechanical vibrations in the thing being moved. Mechanical oscillations and vibrations may be generally referred to as sound oscillations and vibrations, and mechanical frequency may be referred to as pitch, or alternatively, sound wave pitch. If the movement of an object is not continuous or changes due to some occurrence of a mechanical event, such as a collision or an acceleration, a damped or decaying sound oscillation may be generated. Such sound oscillations may range from 0.1 Hz to 200 kHz and may further contain a DC component due to interference from frequency components associated with the oscillations.

With respect to end effector use, mechanical vibrations intrinsically arise, for example, in the exchanging of substrates in a process tool before, during and after a process activity. Examples of end effector movement include tilt, rotation, acceleration, and sag. Other mechanical vibrations may occurs as a parasitic product of robot tool and process tool use. Examples of such parasitics include high and low frequency vibrations arising from motors, turbines, pump exhaust, gears, belts, blowers and pressure differentials. Still other movement may occur as anomalous and irregular mechanical events associated with robot and end effector use. Examples of such mechanical irregularities include collisions, compressions, and nonlinear motion due to changes in friction, stepper motor irregularities and slippage. Monitoring these and other mechanical vibrations may be performed using one or more accelerometers 350. In some embodiments, the accelerometer 350 operates as a diagnostic instrument. In various embodiments, combination of two or more accelerometers 350 may be used to provide diagnostic information. In some embodiments, one or more accelerometers 350 may be used in various combinations to monitor motion and to provide operational feedback to a robot tool, process tool and an end effector. In various embodiments, the accelerometers 350 may be used to sense sound oscillations associated with changes in materials and components connected to the end effector. In various embodiments, the accelerometers 350 may be used to sense sound oscillations occurring in the end effector itself. In some embodiments, the accelerometers 350 may be used to sense oscillation occurring in the wafer carrier or a semiconductor wafer being held by the wafer carrier.

The end effector 330 operation may be tracked through the detection of sound oscillations using one or more accelerometers 350 positioned on the end effector. Such sound oscillations or mechanical vibrations permits monitoring of acceleration, velocity, direction, displacement, and position. Continuous tracking may be provided by accelerometers 350 by transmitting vibration related information in near real time. Intermittent end effector position tracking may be achieved by storing the accelerometer data in a local buffer, for example, and burst transmitting the information according to a specified command to the processor 335. In various embodiments, the accelerometer data may be used to adjust motion and position of the robot tool and/or end effector 330. In some embodiments, the accelerometer data may be used to predict damage occurring to the end effector 330, the robot tool and the process tool.

The end effector 330 may be attached to, support by or otherwise hold a wafer carrier. The wafer carrier may further support a semiconductor substrate or a platen holding a plurality of semiconductor substrates. In an embodiment, the wafer carrier is a platen. Irregular mechanical events such as collisions, tilts, compressions and vibrations occurring during a process activity or motion of the end effector 330 may adversely affect the mechanical integrity of the wafer carrier, semiconductor substrate and the platen being supported. In various embodiments, accelerometer data may be used as part of a process activity assessment. In some embodiments, the semiconductor substrate undergoing a process activity includes a portion of a circuit associated with a semiconductor memory such as capacitors, electrodes, conductors, transistors, and insulators. In various embodiments, the process activity includes moving the semiconductor substrate using the end effector according to a semiconductor manufacturing process requirement. In some embodiments, the semiconductor substrate position may be tracked or monitored using the information provided by the accelerometers. In various embodiments, sound oscillation occurring in the semiconductor wafer supported by the carrier due to a mechanical event may be sensed by the accelerometers and may be used to predict damage occurring to the wafer carrier, platen and semiconductor substrate. In various embodiments, the accelerometer data may be used for determining whether to discontinue a process activity or to discard a semiconductor substrate due to a mechanical event.

Figure 4:
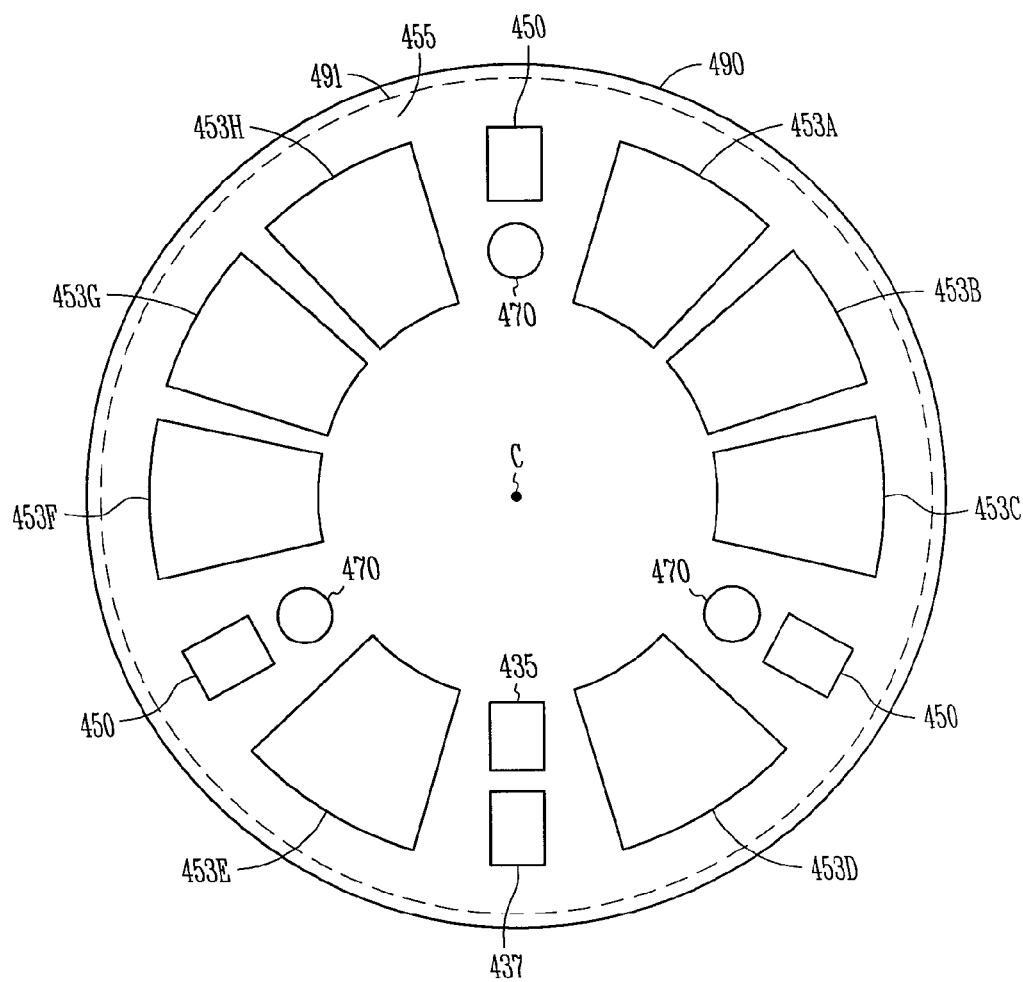
FIG. 4 is a surface view illustrating generally an end effector mount according to various embodiments of the invention.

FIG. 4 is a surface view illustrating generally one embodiment of an end effector mount 490. In this embodiment, the end effector mount 490 is shaped to accept a semiconductor substrate such as a silicon substrate. Accelerometers 450 may be positioned outward in the radial direction from the geometric center C toward the circumference 491 of the carrier 455 at angles of approximately 120° to form an isosceles triangle-like arrangement. Accuracy and precision increase as the accelerometers are positioned closer to the edge of the carrier. Accuracy and precision generally increase as the distances between the accelerometers 450 increase. In general, each accelerometer may be mounted on the carrier 455 at any location desired. Cutouts 453A-H are shaped and sized to reduce carrier weight while preserving adequate carrier strength and area to support a substrate and associated electronics. In general, the cutouts 453A-H may be of any shape, size, and number desired. In one embodiment, the carrier 455 is free of any cutouts.

The angular separation between accelerometers 450, in general, depends on the number of accelerometers, and may include more or less than three. In various embodiments, the accelerometers 450 are positioned on the carrier 455 non-symmetrically. In some embodiments, the accelerometers 450 are positioned on the carrier 455 relative to the carrier's center of mass. In some embodiments, the accelerometers 450 are positioned relative to the outer surface edge of the carrier 455. In various embodiments, the accelerometers 450 are positioned inward along the circumference 491 of the carrier 490. In some embodiments, the carrier 455 is formed of 0.031 inch thickness circuit board material. In some embodiments, the carrier 455 is formed of 0.025-0.10 inch thickness circuit board material. In various embodiments, the carrier 455 may be formed from Mylar. In some embodiments, the carrier 455 includes circuit board material (e.g., FR-4) in combination with titanium or aluminum. In some embodiments, the carrier 455 includes circuit board material in combination with titanium or aluminum used as a frame. In some embodiments, power is supplied to the carrier 455 using a cable coupled to a network device such as a computer or a server.

Accelerometers 450 include multiple sensor elements to sense mechanical motion and may include transducer elements to convert sensed motion to electrical signals for further processing. Accelerometers 450 may use a three-sensor element configuration to measure movement in the x, y and z direction. In various embodiments, the accelerometers 450 include three transducer elements to convert movement in the x, y and z direction to electrical signals. Examples of sensor elements include membrane materials, piezoelectric materials, magnetic materials, and optical materials. Examples of transducer elements include capacitive structures using a flexible membrane configured as a cantilever or other beam-like structure to sense changes in electrode separation, piezoelectric effect-based structures, magnetic couplers and relays, and coherent radiation and spontaneous emission type structures that use an optical gain effect. In some embodiments, the accelerometers may comprise KIONIX™ triaxial accelerometers such as the model KXP74-1050. The KIOINIX™ KXP52 series data sheet and KXP74-1050 specifications are herein incorporated by reference. More information regarding the KXP74-1050 accelerometer and others accelerometers can be found in the product literature provided by Kionix, Inc. of Ithaca, N.Y. In various embodiments, the accelerometer may use a serial peripheral interface (SPI) capable of communication using a bandwidth of several megahertz. In some embodiments, the SPI may be capable of operating up to at least 3 MHz. For example, for three accelerometers the minimum SPI operating bandwidth may exceed 500 kHz. In various embodiments, a triaxial accelerometer may be used to provide data at a rate of 3000 samples per second, and more. In some embodiments, a three triaxial accelerometer arrangement includes three sensor elements per accelerometer to provides nine possible transduced signals for processing. In some embodiments, the transduced signals may be selectable by a processor. In various embodiments, the transduced signals may be streaming signals.

In some embodiments, the accelerometers 450 may operate in a free-running mode such that transduced data signals are continuously available for further transmission or processing. In various embodiments, the transduced signals output by the accelerometers 450 comprise digital signals. In some embodiments, the transduced signals output may comprise analog signals. Various embodiments include accelerometer output signals that include analog and digital signals. In some embodiments, the output signals are selected according to signals received from a remote device such as a controller or a processor. In some embodiments, the accelerometers 450 are attached to the carrier 455. In various embodiments, the accelerometers 450 are supported by the carrier 455. In some embodiments, the accelerometers 450 are removable.

Processor 435 may be coupled to accelerometers 450 to receive data provided by the accelerometers 450. In various embodiment, the processor 435 may be coupled to the accelerometers 450 using an SPI capable of operating at up to 500 kHz, and beyond. The processor 435 may track received accelerometer data by stamping each reading with a unique identifier that may be stored in memory. In some embodiments, the data may be stored in a local buffer memory for subsequent transfer and use. In various embodiments, the processor may comprise a microcontroller such as a MICROCHIP™ PIC18F8722, as well as other suitable processors. In this embodiment, the PIC18F87722 may operate to accept an 8 byte output from the accelerometers in a sequence of 1-1-4-2 bytes: packet start byte FF—axis value byte—28 bit count—12 bit acceleration value. The PIC18F8722 family data sheet, available from Microchip Technology Inc. of Chandler, Ariz., is herein incorporated by reference.

Carrier and/or end effector position may be continuously determined and monitored by establishing an initial carrier position and velocity. Initial carrier position and velocity may be used in a feedback loop to maintain position and velocity and/or to predict position and velocity based on specified conditions. In various embodiments, the data sampled may be used to determine one or more frequency components. In some embodiments, the sampled data may be used to determine a differential frequency between two or more sensor elements. For example, the frequency components of one or more sensor elements associated with an accelerometer may be compared with the frequency components of one or more sensor elements associated with a different accelerometer. In some embodiments, the sampled data may be used to determine a differential frequency for one sensor element or one accelerometer. In various embodiments, the sampled data may be used to determine a frequency change, or a derivative of a frequency change. In some embodiments, the sampled data may be used to determine an instantaneous frequency change associated with one or more sensors and/or one or more accelerometers. In some embodiments, the sampled data may be used to determine a sound oscillation characteristic, such as pitch. In various embodiments, the sampled data may be used to determine a change in sound oscillation characteristic, such as a change in pitch, or a change in damped oscillation frequency. Such changes may be compared.

Processor 435 may transmit an address signal, corresponding to an axis, to the accelerometers 450 to specify a data channel to permit the transfer of data associated with sensed movement to the processor 435 for further use. The processor 435 may specify the number of open data channels using the address. For example, in the case of three accelerometers, the processor 435 may elect to receive information from all three accelerometers 450 at 3000 samples per second, or may elect to receive data from any one of the three accelerometers to enable faster sampling and higher resolution.

In general, the sampling rate or sampling frequency should exceed the Nyquist rate to avoid signal aliasing. Aliasing generally results in the loss of information due to overlapping frequency bandwidths. The Nyquist frequency is generally accepted to be twice the bandwidth of the maximum frequency of oscillations of the event of interest. For example, for three open accelerometer channels, 3000 samples per second enables accurate detection and measurement of mechanical vibrations of approximately 500 Hz per channel. Consequently, sampling only one channel by the processor enables mechanical vibrations of up to 1500 Hz to be accurately determined. Sampling two open accelerometer channels enables mechanical vibrations of up to 750 Hz to be measured without aliasing. In some embodiments, the processor 435 includes sampling circuitry. In various embodiments, the processor 435 operates as a sampling circuit. In some embodiments, the processor 435 receives signals associated with mechanical events or irregularities such as collisions, compressions, nonlinear movement, accelerations, velocities, and displacements. In various embodiments, the sampling rate is greater than 3000 samples per second. In some embodiments, the sampling rate is adjusted to be between 500 and 3000 samples per second. In various embodiments, the processor 435 adjusts the number of channels open.

Processor 435 may be electrically coupled to transmit and receive circuitry 437 such as an enhanced universal synchronous/asynchronous receiver transmitter (EUSART). In various embodiments, the EUSART may be a BLUETOOTH™ compatible transceiver. Other transmit and receive circuitry and other transmission protocols may be used. In some embodiments, the processor 435 is coupled to a universal synchronous/asynchronous receiver transmitter (USART). In various embodiments, the USART is emulated. Transmit and receive circuitry 437 may provide signals to the processor 435 and receive data transmitted from the processor 435. Transmit and receive circuitry 437 may further cooperatively communicate with a remote processor, such as a central computer associated with a factory, a robot tool processor, or a process tool processor.

In various embodiments, the transmit and receive circuitry 437 use an asynchronous communication protocol. In some embodiments, the transmit and receive circuitry use a synchronous transmission protocol. Various embodiments include circuitry using IEEE (Institute of Electrical and Electronic Engineers) standard protocols such as an IEEE 802.15.1 protocol or an IEEE 802.15.3a protocol. In some embodiments, the transmit and receive circuitry 437 and the processor 435 are attached to the carrier. In various embodiments, the transmit and receive circuitry 437 and the processor 435 are supported by the carrier. In some embodiments, the transmit and receive circuitry 437 and the processor 435 are removable such that they can be separately replaced.

A battery 470 may be electrically coupled to the accelerometers 450 to provide power. The Battery 470 may be a lithium ion battery and may be further coupled to a battery charger such as a Digi-Key 296-9379-5-ND or an equivalent. Power may also be provided to the accelerometers 450 using capacitors coupled to booster circuitry. In various embodiments, the battery 470 includes series coupled batteries to provide a specified voltage. In some embodiments, the batteries 470 are positioned on the carrier 455 at specified distances from the accelerometers 450. In some embodiments, accelerometer power is provided using conductors coupled to a common DC voltage supply. In various embodiments, accelerometer power may be provided by a power source coupled to the processor 435 or the transmit and receive circuitry 437, or even using a supply that powers a robot. In some embodiments, the battery 470 may be a rechargeable-type. In various embodiments, the processor 435 receives a low battery voltage signal.

Figure 5:
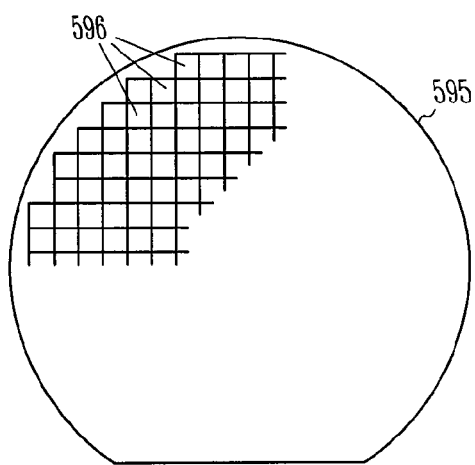
FIG. 5 is a surface view illustrating generally, a semiconductor wafer according to various embodiments of the invention.

FIG. 5 illustrates generally, a semiconductor wafer 595 according to various embodiments of the invention. In some embodiments, semiconductor wafer 595 may comprise a silicon substrate. The semiconductor wafer 595 may be attached or otherwise supported by the end effector mount 490 (see FIG. 4) during the time the wafer is undergoing a semiconductor process activity or is moved by a robot tool. The process activity may be associated with the fabrication of circuitry such as an output driver circuit, a processor, a display, a DRAM, an SRAM, and a flash memory. Examples of process activity include epitaxial film growth, deposition, metallization, lithography, etching, thinning, scribing, pick and place, and encapsulation. In various embodiments, the semiconductor wafer 595 includes a portion of a circuit associated with a semiconductor memory such as capacitors, electrodes, conductors, transistors, and insulators. In some embodiments, semiconductor wafer 595 may include partially or fully formed circuitry as is typical during semiconductor fabrication. A number of dice 596 may be formed on the semiconductor wafer. Dice 596 may be individually patterned as distinct circuits having different functionalities or may comprise circuitry with the same functionality formed as a repeated pattern with a shape and size determined according to particular design specifications. In some embodiments, the end effector mount 490 (see FIG. 4) may support a platen further supporting a plurality of semiconductor wafers 595.

A wafer processing accelerometer for use with an end effector has been described. As used herein the terms "semiconductor substrate" and "semiconductor wafer" have the same meaning and may be used interchangeably. According to various embodiments, the accelerometer may include one or more vibrations sensor modules supported by a carrier. Accelerometer power may be supplied by a battery, as well as by other DC sources. In some embodiments, power is supplied to the carrier using a cable coupled to a network device such as a computer or a server. In some embodiments, accelerometer power is supplied using a supply that powers a robot. In various embodiments, the accelerometer is configured in a triaxial arrangement to sense motion and to provide one or more signals to a processor. The processor may be used to control accelerometer signal sampling rate and transmission mode. Data received by the processor may be stored locally in a buffer memory associated with processor supported by an end effector for subsequent analysis, and/or transmitted to external memory for further processing. In various embodiments, the processor comprises a microprocessor. In some embodiments, the processor is a reduced instruction set processor. In various embodiments, the processor includes a digital signal processor. In some embodiments, the processor includes sampling circuitry that operates as a digital signal processor.

Movement of an end effector and changes in movement induce vibrations that may be sensed by an accelerometer. Sensed mechanical movement may be converted to electrical signals and communicated to a processor according to conditions specified by the processor. The processor may be communicatively coupled to a transceiver to relay commands and data between another processor according to various synchronous and asynchronous protocols. In various embodiments, the accelerometer data may be used to determine motion, direction and position associated with an end effector. Information based on the accelerometer data may be used to direct subsequent movement of the end effector, a robot arm, a stepper motor, or a robot tool.

In some embodiments, the accelerometer includes a processor. Various embodiments include an accelerometer that includes transmit and receive circuitry such as a transceiver. In some embodiments, the accelerometer includes a plurality of sensors and transducers. In some embodiments, the accelerometer includes transmit and receive circuitry and a processor. According to various embodiments, the accelerometer is affixed to a carrier that is affixed to an end effector of a robot tool. In various embodiments, the accelerometer is modular such that it can be easily removed and replaced by an equivalent accelerometer. Various embodiments include a carrier that is removably attached to the end effect such that the carrier and accelerometer are replaceable as a unit. In some embodiments, the accelerometer is integrated with the end effector so to provide replacement or substitution of the end effector with a similar or functionally different end effector.

This Detailed Description includes references to the accompanying drawings, which form a part of the detailed description. The drawings show, by way of illustration, specific embodiments. These embodiments, which are also referred to herein as "examples," are described in enough detail to enable those skilled in the art to practice the invention. The embodiments may be combined, other embodiments may be utilized, or structural, logical and electrical changes may be made without departing from the scope of the present invention. The Detailed Description is, therefore, not to be taken in a limiting sense, and the scope of the various embodiments is defined only by the appended claims and their equivalents.

In this document, the terms "a" or "an" are used, as is common in patent documents, to include one or more than one. In this document, the term "or" is used to refer to a nonexclusive or, unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

It is to be understood that the above description is intended to be illustrative, and not restrictive. For example, the above-described embodiments (and/or aspects thereof) may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract is provided to comply with 37 C.F.R. §1.72(b), which requires that it allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

What is claimed is:

1. A motion sensor for a semiconductor process tool comprising:
   two or more accelerometers, wherein each of the two or more accelerometers is addressable by a processor; and
   a semiconductor wafer carrier coupled to the two or more accelerometers such that data operatively derived from measurements by the two or more accelerometers provides information on the status of the semiconductor wafer carrier, the semiconductor wafer carrier coupled to at least one power source, the semiconductor wafer carrier adapted to support a semiconductor substrate and operatively coupled to the semiconductor process tool.

2. The motion sensor of claim 1, wherein the at least one power source includes a battery.

3. The motion sensor of claim 2, wherein the at least one power source is coupled to the two or more accelerometers.

4. The motion sensor of claim 1, wherein the two or more accelerometers are configured to receive information associated with mechanical events.

5. The motion sensor of claim 1, wherein the two or more accelerometers are removably attached to the carrier.

6. The motion sensor of claim 1, wherein at least one of a sampling speed and an address is transmitted to the two or more accelerometers by the processor.

7. The motion sensor of claim 1, wherein the processor includes a digital processor.

8. The motion sensor of claim 1, wherein the two or more accelerometers use at least one of a piezoelectric effect, a capacitance change, and a membrane displacement.

9. The motion sensor of claim 1, wherein the two or more accelerometers are positioned at specified distances from the geometric center of the carrier.

10. The motion sensor of claim 1, wherein the two or more accelerometers are symmetrically positioned from the geometric center of the carrier.

11. The motion sensor of claim 1, wherein the two or more accelerometers are positioned equidistant to each other.

12. The motion sensor of claim 1, wherein the two or more accelerometers are positioned at specified distances from an outer surface of the carrier.

13. The motion sensor of claim 1, wherein the carrier is formed to accept the processor.

14. The motion sensor of claim 1, wherein the carrier is formed to accept transmit and receive circuitry such as a transceiver.

15. The motion sensor of claim 1, wherein the semiconductor substrate includes at least a portion of a circuit associated with a semiconductor memory.

16. A process tool accelerometer comprising:
    three or more motion transducers, wherein the three or more motion transducers are supported by a semiconductor wafer carrier such that data operatively derived from measurements by the three or more motion transducers provides information on the status of the semiconductor wafer carrier, the three or more motion transducers being of a same type of motion transducer, wherein the semiconductor wafer carrier is operatively coupled to at least one semiconductor process tool using an end effector;
    at least one voltage supply coupled to the one or more motion transducers; and
    a sampling circuit operatively coupled to the three or more motion transducers.

17. The process tool accelerometer of claim 16, wherein the three or more motion transducers are attached to the semiconductor wafer carrier.

18. The process tool accelerometer of claim 16, wherein the three or more motion transducers are positioned at specified distances from the center of the semiconductor wafer carrier.

19. The process tool accelerometer of claim 16, wherein the three or more motion transducers are positioned near along the circumference of the semiconductor wafer carrier.

20. The process tool accelerometer of claim 16, wherein the three or more motion transducers are configured to provide a voltage based on at least one of a collision, a deflection, a tilt, and a compression.

21. The process tool accelerometer of claim 16, wherein the three or more motion transducers are positioned at specified distances inward radially from an outer surface of the semiconductor wafer carrier.

22. The process tool accelerometer of claim 16, wherein the sampling circuit includes a controller such as a microprocessor.

23. The process tool accelerometer of claim 16, wherein the sampling circuit includes a digital signal processor.

24. The process tool accelerometer of claim 16, wherein the sampling circuit are configured to receive at least one of a digital voltage and an analog voltage from the three or more motion transducers.

25. A process tool accelerometer comprising:
one or more motion transducers, wherein the one or more motion transducers are supported by a semiconductor wafer carrier, wherein the semiconductor wafer carrier is operatively coupled to at least one semiconductor process tool using an end effector;
at least one voltage supply coupled to the one or more motion transducers; and
a sampling circuit operatively coupled to the one or more motion transducers, wherein the sampling circuit includes circuitry for adjusting a sampling rate.

26. The process tool accelerometer of claim 16, wherein each of the three or more motion transducers includes at least one sensor configured to detect movement of the semiconductor wafer carrier.

27. The process tool accelerometer of claim 16, wherein each of the three or more motion transducers includes a set of three displacement sensors.

28. The process tool accelerometer of claim 16, wherein the sampling circuit includes circuitry for transmitting a processor address to the three or more motion transducers.

29. A process tool accelerometer comprising:
one or more motion transducers, wherein the one or more motion transducers are supported by a semiconductor wafer carrier, wherein the semiconductor wafer carrier is operatively coupled to at least one semiconductor process tool using an end effector;
at least one voltage supply coupled to the one or more motion transducers; and
a sampling circuit operatively coupled to the one or more motion transducers, wherein the sampling circuit is configured to select a sampling rate according to the number of the one or more motion transducers selected.

30. The process tool accelerometer of claim 16, wherein a processor is communicatively coupled to the three or more transducers.

31. A method comprising:
detecting mechanical events according to a first specified condition using two or more accelerometers, wherein each of the two or more accelerometers is addressable by a processor, the mechanical events associated with at least one of a substrate carrier and a semiconductor wafer, the two or more accelerometers operated such that data operatively derived from measurements by the two or more accelerometers provides information on the status of the substrate carrier;
coordinating a transfer of transduced information associated with a second specified condition; and
transmitting the transduced information as packet-switched data to a remote memory location.

32. The method of claim 31, wherein detecting includes detecting at least one of a displacement, a collision, and a compression.

33. The method of claim 31, wherein detecting includes detecting mechanical oscillations.

34. The method of claim 33, wherein detecting includes detecting at least one of a sound pitch and a change in sound pitch.

35. A method comprising:
detecting mechanical events according to a first specified condition, the mechanical events associated with at least one of a substrate carrier and a semiconductor wafer;
coordinating a transfer of transduced information associated with a second specified condition, wherein coordinating includes synchronizing a transfer of information; and
transmitting the transduced information as packet-switched data to a remote memory location.

36. The method of claim 35, wherein coordinating includes selectively activating data channels.

37. The method of claim 31, wherein coordinating includes coordinating a transfer of information to a buffer memory.

38. A method comprising:
detecting mechanical events according to a first specified condition, the mechanical events associated with at least one of a substrate carrier and a semiconductor wafer;
coordinating a transfer of transduced information associated with a second specified condition, wherein coordinating includes switching a data transfer rate according to a third specified condition; and
transmitting the transduced information as packet-switched data to a remote memory location.

39. The method of claim 31, wherein transmitting includes transmitting through a medium that includes free-space.

40. A method comprising:
sensing a vibration of a semiconductor wafer carrier using two or more accelerometers, wherein each of the two or more accelerometers is addressable by a processor, the two or more accelerometers operated such that data operatively derived from measurements by the two or more accelerometers provides information on the status of the semiconductor wafer carrier;
selecting a data transfer rate according to a predetermined signal; and
determining a frequency change associated with the vibration based on the data transfer rate.

41. The method of claim 40, wherein sensing includes sensing a transduced signal based on the vibration.

42. The method of claim 40, wherein selecting includes selecting a rate based on an available bandwidth.

43. The method of claim 40, wherein determining includes determining a frequency change associated with at least one of a change in a position, a movement, and an angle.

44. The method of claim 40, wherein determining includes determining a differential frequency change.

45. The method of claim 40, wherein determining includes determining a derivative of a frequency.

46. The method of claim 40, wherein determining includes determining a derivative of a frequency differential.

47. The method of claim 40, wherein determining includes determining a change in a damped oscillation rate.

48. The method of claim 47, wherein determining includes comparing changes in damped oscillation rates.

49. The method of claim 40, wherein determining includes correlating an event associated with at least one of a position, a mechanical anomaly, a movement, a tilt, and a collision.

* * * * *